United States Patent
Won (10) Patent No.: US 7,371,651 B2
(45) Date of Patent: May 13, 2008

(54) FLAT-TYPE CAPACITOR FOR INTEGRATED CIRCUIT AND METHOD OF MANUFACTURING THE SAME

(75) Inventor: Seok-Jun Won, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/608,713

(22) Filed: Dec. 8, 2006

(65) Prior Publication Data

US 2007/0077722 A1 Apr. 5, 2007

Related U.S. Application Data

(62) Division of application No. 10/676,865, filed on Sep. 30, 2003, now Pat. No. 7,180,117.

(30) Foreign Application Priority Data

Feb. 5, 2003 (KR) ............................... 2003-07160

(51) Int. Cl.
*H01L 21/20* (2006.01)
(52) U.S. Cl. ............................... 438/393; 257/E21.011
(58) Field of Classification Search ................ 438/393; 257/E21.011
See application file for complete search history.

(56) References Cited

U.S. PATENT DOCUMENTS 5,708,559 A 1/1998 Brabazon et al.
6,271,596 B1 8/2001 Alers
6,472,754 B2 10/2002 Nakajima et al.
6,492,223 B2 12/2002 Kanamori et al.
2003/0109135 A1* 6/2003 Kim ........................... 438/681
2004/0084709 A1 5/2004 Kim et al.

FOREIGN PATENT DOCUMENTS

| JP | 9-162369 | 6/1997 |
|---|---|---|
| JP | 2000-228497 | 8/2000 |
| JP | 2001-308287 | 11/2001 |

OTHER PUBLICATIONS

English language abstract of Japanese Publication No. 9-162369.
English language abstract of Japanese Publication No. 2000-228497.
English language abstract of Japanese Publication No. 2001-308287.

* cited by examiner

*Primary Examiner*—Lex Malsawma
(74) *Attorney, Agent, or Firm*—Marger Johnson & McCollom, P.C.

(57) ABSTRACT

Embodiments of the invention provide flat-type capacitors that prevent degradation of the dielectric layer, thereby improving the electrical properties of the capacitor. The capacitor includes a lower interconnection formed in a predetermined portion of a semiconductor substrate, a lower electrode formed on the lower interconnection that is electrically coupled to the lower interconnection; a concave dielectric layer formed on the lower electrode; a concave upper electrode formed on the dielectric layer; a first upper interconnection that is electrically coupled to the lower interconnection; and a second upper interconnection that is coupled to the upper electrode. The concave upper electrode is larger than the lower electrode.

19 Claims, 4 Drawing Sheets

FLAT-TYPE CAPACITOR FOR INTEGRATED CIRCUIT AND METHOD OF MANUFACTURING THE SAME

CROSS REFERENCE TO RELATED APPLICATIONS

This application is a Divisional of U.S. patent application Ser. No. 10/676,865, filed on Sep. 30, 2003, now U.S. Pat. No. 7,180,117, which claims priority from Korean Patent Application No. 2003-07160, filed on Feb. 5, 2003, the disclosures of which are incorporated herein in their entirety by reference.

BACKGROUND OF THE INVENTION

1. Field of the Invention

This disclosure relates to a flat-type capacitor for an integrated circuit that can obtain better characteristics by preventing degradation of a capacitor dielectric layer and a method of manufacturing the same.

2. Description of the Related Art

Capacitors are essential to semiconductor memory devices, radio frequency (RF) devices, mixed signal devices, and system drivers.

While capacitors for an integrated circuit (IC) may have various shapes, a typical capacitor, which is normally called a "thin flat-type capacitor," includes parallel thin conductive layers separated by a dielectric layer.

Figure 1:
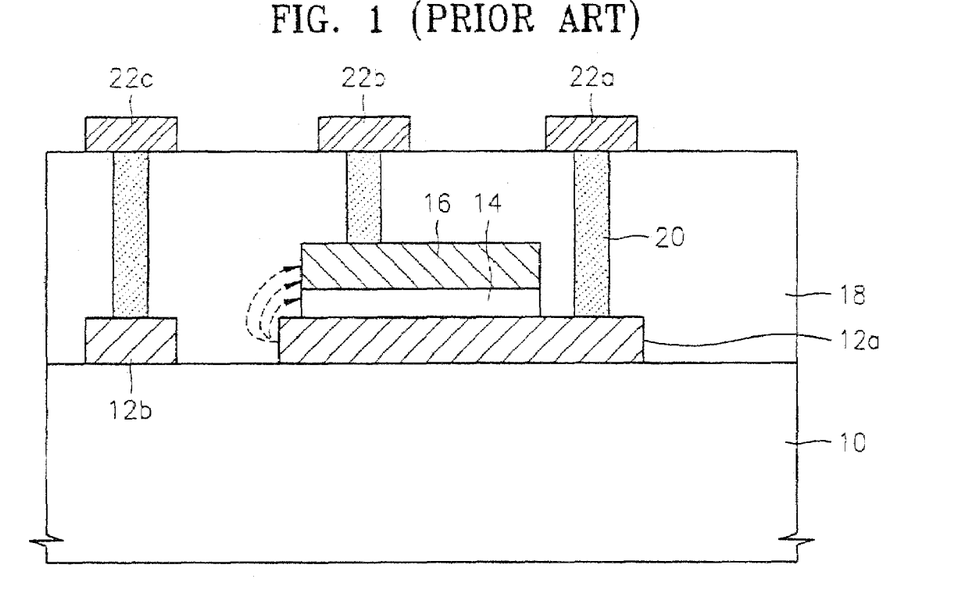
FIGS. 1 through 3 are cross-sectional diagrams of conventional flat-type capacitors.

FIG. 1 is a cross-sectional diagram of a typical flat-type capacitor for an IC. Referring to FIG. 1, to form the flat-type capacitor, a first metal layer is deposited on a semiconductor substrate 10. The semiconductor substrate 10 may be a silicon substrate where IC devices and metal interconnections are formed. A predetermined portion of the first metal layer is patterned to form a lower electrode 12a and a first metal interconnection 12b.

Afterwards, a dielectric layer 14 and a metal layer for an upper electrode are sequentially deposited on the resultant structure of the semiconductor substrate 10, and then the metal layer for an upper electrode and the dielectric layer 14 are etched until a predetermined portion of the lower electrode 12a is exposed. Here, the dielectric layer 14 is etched such that the predetermined portion of the lower electrode 12a is exposed without leaving the dielectric layer 14 as a residue. Also, the predetermined portion of the lower electrode 12a is exposed so as to electrically connect the lower electrode 12a with an upper metal interconnection to be formed at a later time. Next, an interlayer dielectric (ILD) 18 is formed on the resultant structure. The ILD 18 is etched until the lower electrode 12a, the first metal interconnection 12b, and an upper electrode 16 are exposed, thereby forming via holes (not shown).

Plugs 20 are formed by filling the via holes with a conductive material, and second metal interconnections 22a, 22b, and 22c are each formed to contact the respective plugs 20. Here, the second metal interconnection 22a transmits an electric signal to the lower electrode 12a, the second metal interconnection 22b transmits an electric signal to the upper electrode 16, and the second metal interconnection 22c transmits an electric signal to the first metal interconnection 12b.

However, in the typical flat-type capacitor, an etching by-product may be absorbed in the sidewalls of the dielectric layer 14 while the dielectric layer 14 is being etched. As a result, electrical properties of the dielectric layer 14 may be degraded. Also, when the lower electrode 12a is exposed by etching the dielectric layer 14, the lower electrode 12a may be partially etched or residue of the etched lower electrode 12a may re-sputter onto the sidewalls of the dielectric layer 14. In FIG. 1, the arrows with dotted lines indicate the direction of the residue sputtering.

The residue of the dielectric layer 14 or the lower electrode 12a, which is attached to or re-sputtered on the sidewalls of the dielectric layer 14, may be partially removed using a subsequent cleaning process. However, it is impossible to completely remove the etching residue. Therefore, additional fabrication steps are required.

Figure 2:
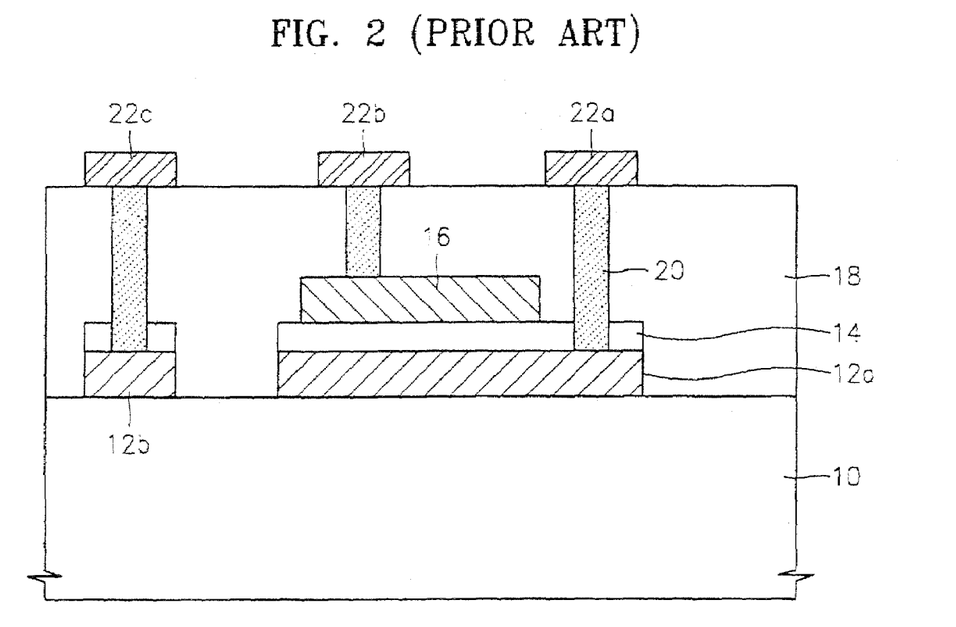

In another conventional method, as shown in FIG. 2, a dielectric layer 14 is etched at the same time as a lower electrode 12a, and only an upper electrode 16 is separately etched on the dielectric layer 14. Afterwards, an ILD 18 and the dielectric layer 14 are simultaneously etched to form via holes. This method as shown in FIG. 2 is also disclosed in FIGS. 1A through 1G of U.S. Pat. No. 6,492,223 to Kanamori, et al.

In the method of FIG. 2, because the upper electrode 16 and the dielectric layer 14 are not etched at the same time, a smaller amount of etching by-product is generated on the sidewalls of the dielectric layer 14. Also, over-etching of the dielectric layer 14 is not required, thus preventing re-sputtering of the lower electrode 12a. However, the ILD 18 and the dielectric layer 14 should be simultaneously etched to form the via holes. Accordingly, since an etch selectivity of the ILD 18 differs from that of the dielectric layer 14, the ILD 18 and the dielectric layer 14 should be etched using separate processes.

Figure 3:
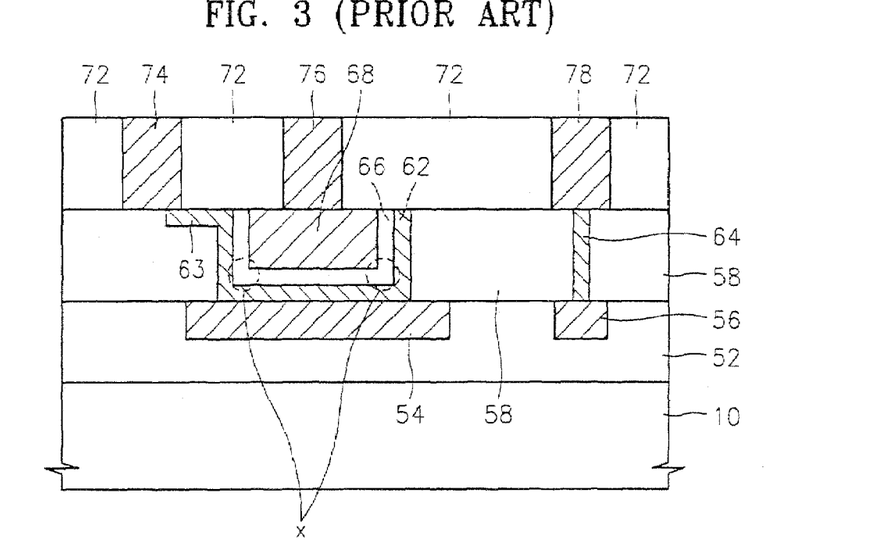

In yet another conventional method, as shown in FIG. 3, a first ILD 52 is deposited on a semiconductor substrate 10, and first metal interconnections 54 and 56 are formed in predetermined portions of the first ILD 52. The first metal interconnections 54 and 56 can be formed by a known damascene method. Here, the first metal interconnection 54 is formed to a wide line width enough to contact a lower electrode to be formed later. A second ILD 58 is deposited on the first ILD 52 including the first metal interconnections 54 and 56. Then, a predetermined portion of the second ILD 58 is etched until the first metal interconnections 54 and 56 are each exposed, thereby defining a concave capacitor region (not shown) and a via hole (not shown).

Afterwards, a conductive layer for a lower electrode and a dielectric layer 66 are sequentially deposited in the capacitor region and then polished using chemical mechanical polishing (CMP). Thus, a lower electrode 62 and the dielectric layer 66 are formed in the concave capacitor region. At the same time, a first plug 64 is formed in the via hole. A conductive layer for an upper electrode is deposited on the dielectric layer 66 and the second ILD 58 so as to fill the capacitor region and then polished using CMP. Thus, an upper electrode 68 is formed to define a concave capacitor. Next, a third ILD 72 is formed on the resultant structure of the semiconductor substrate and then etched until a pad 63 extended from the lower electrode 62, the upper electrode 68, and the first plug 64 are exposed. Thus, via holes are formed. Afterwards, second plugs 74, 76, and 78 are formed by a known method in the via holes positioned in the third ILD 72. The foregoing method as shown in FIG. 3 is also disclosed in FIG. 13 of U.S. Pat. No. 5,708,559 to Brabazon, et al.

With reference to FIG. 3, because the upper electrode is formed by using CMP, an etching byproduct is not absorbed in the sidewalls of the dielectric layer 66. Also, over-etching of the dielectric layer is not required, thus preventing re-sputtering of the lower electrode 62. Furthermore, the dielectric layer 66 and the ILD 58 or 72 may not be simultaneously etched to form via holes.

However, the pad 63 extending from the lower electrode 62, the dielectric layer 66, and the upper electrode 68 are formed using CMP. Thus, if a CMP residue remains on the surface of the dielectric layer 66, a bridge may occur between the lower electrode 62 and the upper electrode 68. Also, scratches due to physical stress may occur on the lower electrode pad 63, the dielectric layer 66, and the upper electrode 68, or chemical defects like erosion can be caused by slurry. As a result, poor contact may occur between the lower electrode pad 63 and the second plug 74 and between the upper electrode 68 and the second plug 76. Further, scratches due to CMP occur in a portion of the dielectric layer 66, which is used as a substantial dielectric layer, thus degrading characteristics of the dielectric layer 66.

Because of stress focused on both sides of the concave capacitor in the region X of FIG. 3, when voltage is applied to the lower electrode 62 and the upper electrode 66, breakdown occurs in region X of the dielectric layer 66. Thus, electrical properties of the capacitor are degraded. This phenomenon results from not only the concave structure of the capacitor but also from poor deposition of the dielectric layer 66 in region X. Consequently, the capacitor of FIG. 3 cannot completely solve the problems of poor contact and a degraded dielectric layer.

Embodiments of the invention address these and other disadvantages of the prior art.

SUMMARY OF THE INVENTION

Embodiments of the invention provide, among other things, a flat-type capacitor with improved electrical properties and a method of manufacturing the same. Improved electrical properties are achieved, in part, by preventing degradation of the dielectric layer.

BRIEF DESCRIPTION OF THE DRAWINGS

The above and other features and advantages of the invention will become more apparent by describing some preferred embodiments thereof with reference to the attached drawings.

DETAILED DESCRIPTION OF THE INVENTION

The invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, the shape and size of elements may be exaggerated for clarity. The same reference numeral in different drawings represent the same element.

Figure 4:
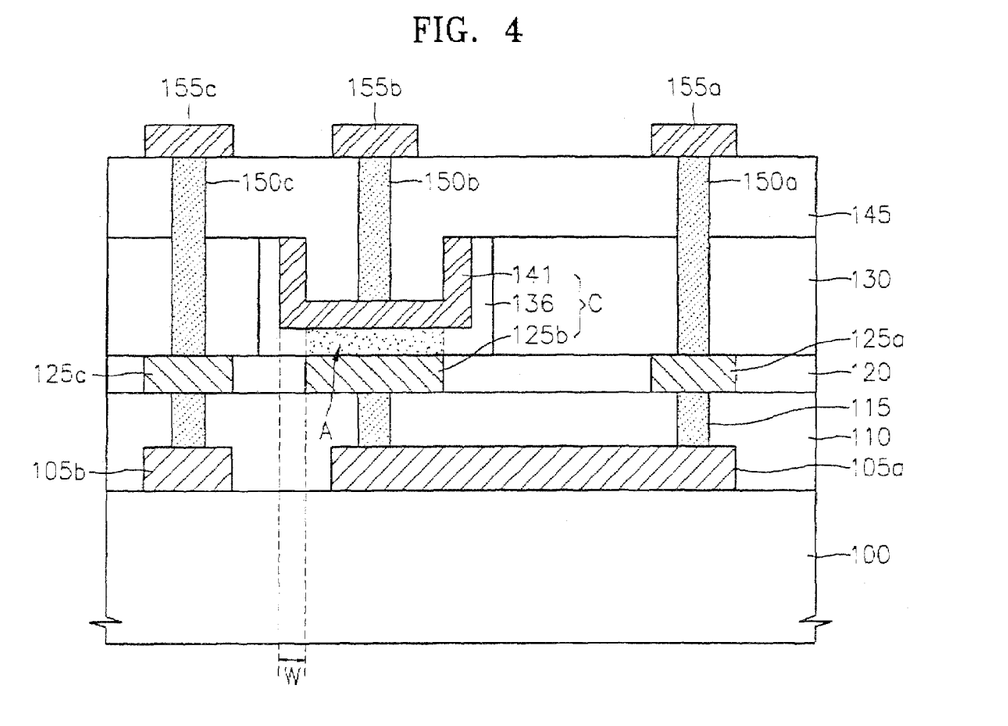
FIG. 4 is a cross-sectional diagram of a flat-type capacitor according to an embodiment of the invention.

Referring to FIG. 4, first metal interconnections 105a and 105b are formed on a semiconductor substrate 100. The first metal interconnection 105a will contact a lower electrode to be formed later and may have a line width that is wider than that of the first metal interconnection 105b. The first metal interconnections 105a and 105b can be formed of Al, Al alloy, W, or Cu. Here, if the first metal interconnections 105a and 105b are formed of Cu, a known damascene method can be used. Also, although the metal interconnections 105a and 105b are referred to here as "first" metal interconnections, they might alternatively be the "second", "third", or "nth" metal interconnections in a different semiconductor integrated circuit. A first ILD 110 is formed on the semiconductor substrate 100 where the first metal interconnections 105a and 105b are formed. The first ILD 110 includes first plugs 115 that each contact the first metal interconnections 105a and 105b. Here, the first metal interconnection 105a contacts two of the first plugs 115, which are spaced apart from each other.

A second ILD 120 is formed on the first ILD 110. Second metal interconnections 125a and 125c and a lower electrode 125b are formed in the second ILD 120 to contact the respective first plugs 115. Here, the dimension of the lower electrode 125b may be larger than that of the second metal interconnections 125a and 125c. The top surfaces of the lower electrode 125b and the second metal interconnections 125a and 125c may be as high as the top surface of the second ILD 120. Also, the lower electrode 125b and the second metal interconnections 125a and 125c may be formed of the same material, for example, a material composed of Ti, Ta, W, TiN, TaN, Al, Cu, Ru, Pt, Ir, or a combination thereof.

A third ILD 130 is formed on the second ILD 120 where the second metal interconnections 125a and 125c and the lower electrode 125b are formed. A concave dielectric layer 136 is formed in the third ILD 130 and a concave upper electrode 141 is formed along the surface of the dielectric layer 136. Thus, a capacitor C is defined along with the lower electrode 125b. The upper electrode 141 may be formed of the same material as the lower electrode 125b or another material composed of Ti, Ta, W, TiN, TaN, Al, Cu, Ru, Pt, Ir, and a combination thereof. Here, the upper electrode 141 is formed to be larger than the lower electrode 125b. More specifically, the dimensions of the concave upper electrode 141 (the length and the width of the upper electrode) are larger than those of the lower electrode 125b (the length and the width of the lower electrode) by a predetermined value W. That is, the upper electrode 141 is formed to cover the lower electrode 125b in all directions. Thus, a portion A of the dielectric layer 136, which corresponds to the lower electrode 125b, serves as a substantial dielectric layer. Here, the dimension of the upper electrode 141 may be larger than that of the lower electrode by about 500 Å to 5000 Å.

A fourth ILD 145 is formed on the third ILD 130. Here, the first through fourth ILDs 110, 120, 130, and 145 may include a silicon oxide layer or may include an insulating layer having the same etch selectivity. Second plugs 150a, 150b, and 150c are formed in the fourth ILD and/or the third ILD, and third metal interconnections 155a, 155b, and 155c are formed on the second plugs 150a, 150b, and 150c, respectively. Here, the second plug 150a and the third metal interconnection 155a are coupled to the second metal interconnection 125a, which is electrically coupled to the lower electrode 125b. The second plug 150b and the third metal interconnection 155b are electrically coupled to the upper electrode 141. Also, the second plug 150b is formed in the fourth ILD 145. The second plug 150c and the third metal interconnection 155c are coupled to the second metal interconnection 125c, which is electrically coupled to the first metal interconnection 105b.

In the flat-type capacitor according to embodiments of the invention, the upper electrode 141 is larger than the lower electrode 125b. Thus, the portion A, which corresponds to the lower electrode 125b, serves as a substantial dielectric layer of the capacitor. Therefore, even if the dielectric layer 136 is not properly deposited at the edges of the capacitor C, because the dielectric layer 136 positioned at the edges is not the portion A, which is a substantial dielectric layer of the capacitor, dielectric characteristics of the capacitor are not degraded from breakdown. Further, as the lower electrode 125b is not extended to the edges of the upper electrode 141, the dielectric layer 136 is not degraded by stress concentration.

Also, even if the lower electrode 125b is formed to have a dimension that is less than that of the upper electrode 141, the first metal interconnection 105a, which is coupled to the lower electrode 125b, is electrically coupled to the third metal interconnection 155a via the first plug 115, the second metal interconnection 125a, and the second plug 150a. Accordingly, electrical problems do not occur.

Hereinafter, a method of manufacturing a flat-type capacitor according to an embodiment of the invention will be described.

Figure 5A:
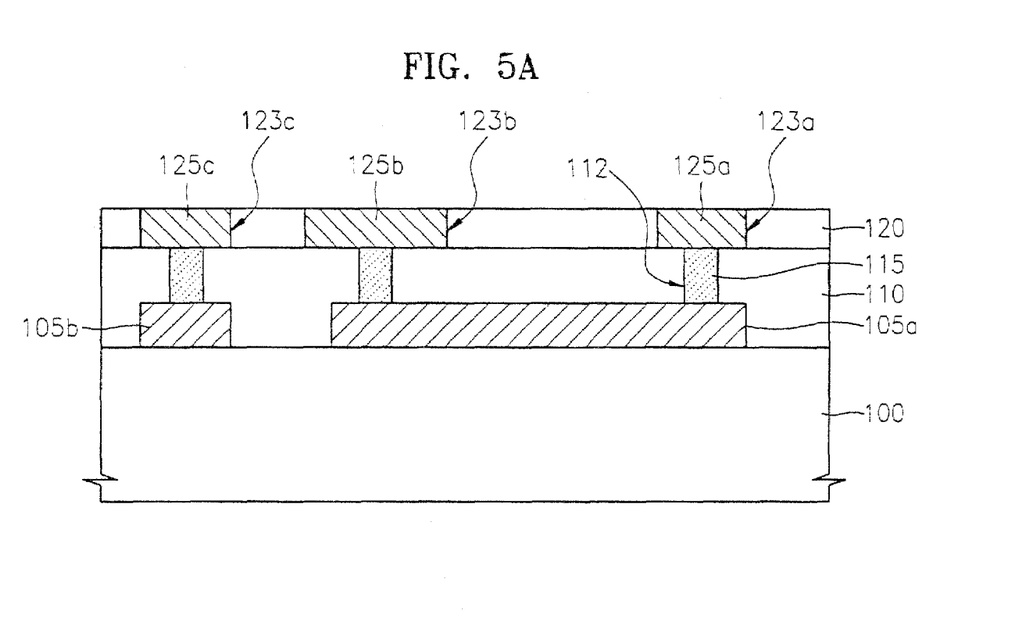
FIGS. 5A through 5D are cross-sectional diagrams illustrating a method of manufacturing the flat-type capacitor according to an embodiment of the invention.

As shown in FIG. 5A, a metal layer is formed on a semiconductor substrate 100, for example, a semiconductor substrate where a semiconductor circuit pattern and an insulating layer are formed. Then, a predetermined portion of the metal layer is patterned to form first metal interconnections 105a and 105b. Here, the first metal interconnection 105a is used to connect a lower electrode that is formed at a later time with an external interconnection (e.g., a third metal interconnection). A first ILD 10 is formed on the semiconductor substrate 100 where the first metal interconnections 105a and 105ba are formed. Next, the first ILD 110 is etched until the first metal interconnections 105a and 105b are exposed, thereby forming first via holes 112. Here, the first via holes 112 are preferably formed such that at least two portions of the first metal interconnection 105a are exposed. A conductive material is deposited on the first ILD 110 and then planarized using an etchback process or a CMP process until the surface of the first ILD 110 is exposed, thereby forming first plugs 115.

A second ILD 120 is deposited on the first ILD 110. The second ILD 120 is preferably formed to a thickness of a lower electrode or a second metal interconnection that will be formed at a later time. Afterwards, a predetermined portion of the second ILD 120 is etched until the first plugs 115 are each exposed, thereby defining regions 123a and 123c where second metal interconnections will be formed (hereinafter, referred to as "second metal interconnection regions") and a region where a lower electrode will be formed (hereinafter, referred to as a "lower electrode region"). The second metal interconnection regions 123a and 123c and the lower electrode region 123b may be formed to have a line width that is larger than that of each of the plugs 115. In particular, the lower electrode region 123b may be formed to be larger than the second metal interconnection regions 123a and 123c.

Referring to FIG. 5A, a metal layer is deposited on the second ILD 120 so as to fill the second metal interconnection regions 123a and 123c and the lower electrode region 123b. The metal layer may be composed of Ti, Ta, W, TiN, TaN, Al, Cu, Ru, Pt, Ir, or a combination thereof. To minimize the influence of a lower interconnection or a lower circuit, the metal layer can be formed using chemical vapor deposition (CVD), physical vapor deposition (PVD), atomic layer deposition (ALD), or electroplating at a relatively low temperature of 250° to 500° C. Afterwards, the metal layer is planarized using an etchback process or CMP process, thereby forming second metal interconnections 125a and 125c and a lower electrode 125b.

Figure 5B:
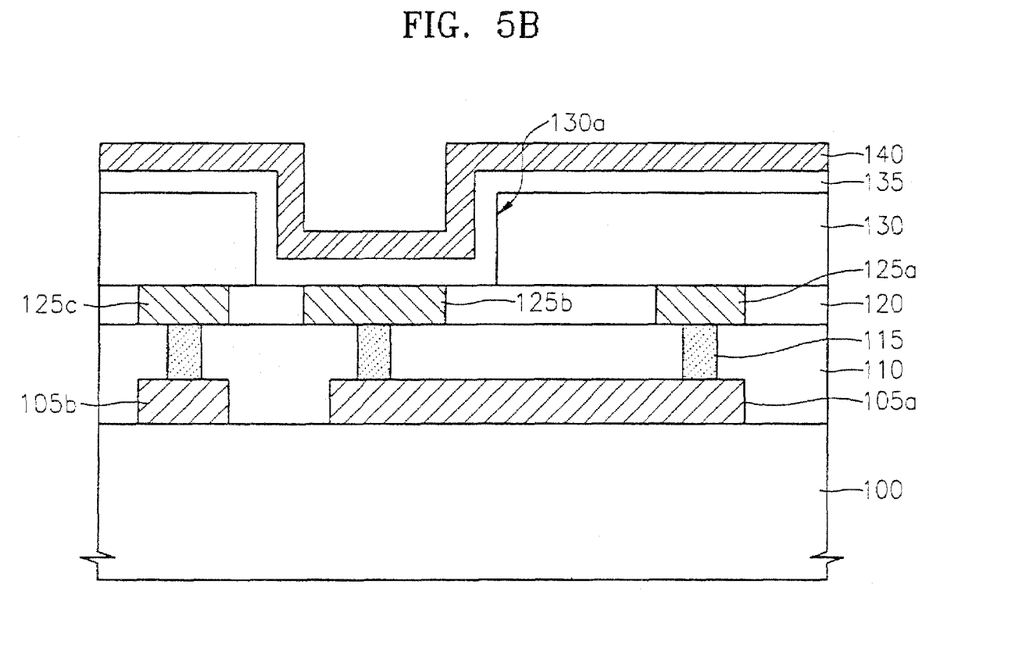

As shown in FIG. 5B, a third ILD 130 is deposited on the second ILD 120 where the second metal interconnections 125a and 125c and the lower electrode 125b are formed. Then, the third ILD 130 is etched until the lower electrode 125b and portions of the second ILD 120 on both sides of the lower electrode 125b are exposed, thereby forming a concave region 130a where a capacitor will be formed (hereinafter, referred to as a "capacitor region"). A dielectric layer 136 and a metal layer 140 for an upper electrode are sequentially stacked on the third ILD 130 where the capacitor region 130a is defined. The dielectric layer 136 may be formed of one of $SiO_2$, $Si_3N_4$, $Ta_2O_5$, $Al_2O_3$, HfO, $ZrO_2$, BST, PZT, and ST. The metal layer 140 for an upper electrode may be composed of the same material as the lower electrode 125 or one of Ti, Ta, W, TiN, TaN, Al, Cu, Ru, Pt, Ir, or a combination thereof. Also, the metal layer 140 for an upper electrode may be formed using one of these processes: CVD, PVD, ALD, and electroplating at a low temperature of 250° to 500° C.

Figure 5C:
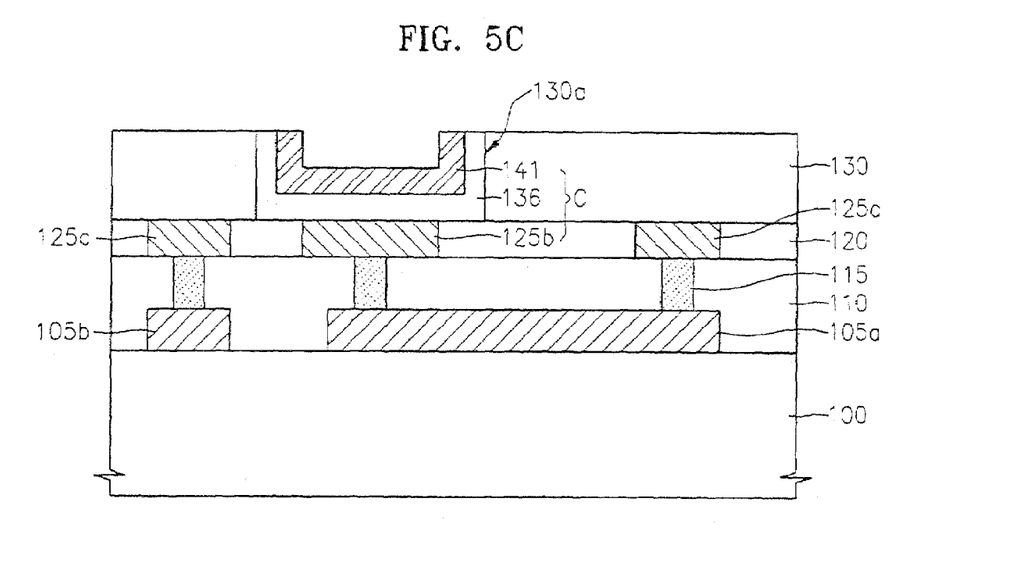

Referring to FIG. 5C, the metal layer 140 for an upper electrode and the dielectric layer 135 are polished using CMP, thereby forming a concave dielectric layer 136 and a concave upper electrode 141 in the capacitor region 130a. Thus, a capacitor C is defined. Here, the metal layer 140 for an upper electrode and the dielectric layer 135 may be polished using CMP in a state where a buffer oxide layer (not shown) is already interposed therebetween. However, even if the buffer oxide layer is not used, a portion of the upper electrode 141, which is positioned on the bottom of the capacitor region 130a, is not directly affected by the CMP process. Thus, since the lower electrode 125b is not defined by the CMP process, even if a CMP residue remains on the polished dielectric layer 135, a short between the lower electrode 125b and the upper electrode 141 does not occur. Also, although the dielectric layer 136 is defined by the CMP process, the polished surface of the dielectric layer 136 is not used as a substantial dielectric layer of the capacitor. As a result, degradation of the dielectric layer 135 can be prevented.

Figure 5D:
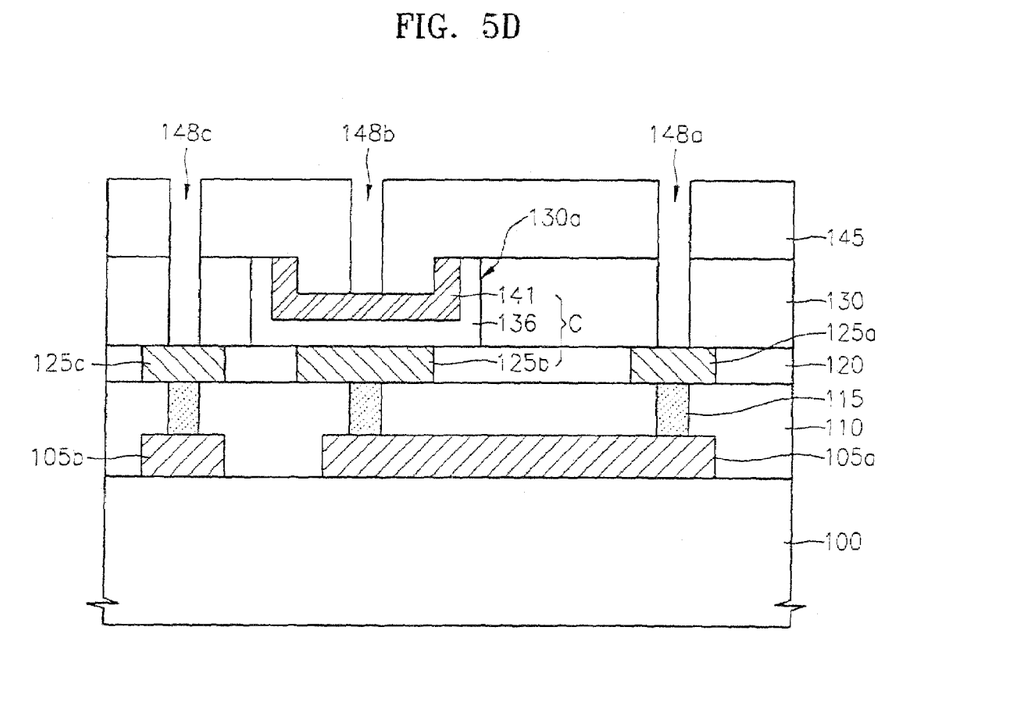

As shown in FIG. 5D, a fourth ILD 145 is deposited on the third ILD 130 where the capacitor C is formed. In the present embodiment, the first through fourth ILDs 110, 120, 130, and 145 may include a silicon oxide layer or be insulating layers having the same etch selectivity. Afterwards, the fourth ILD 145 and the third ILD 130 are etched until the second metal interconnections 125a and 125c and the upper electrode 141 are exposed, thereby defining second via holes 148a, 148b, and 148c. Here, the second via holes 148a, 148b, and 148c expose the second metal interconnection 125a coupled to the lower electrode 125b, the upper electrode 141, and the second metal interconnection 125c coupled to the separated first metal interconnection 105b, respectively.

Next, although not shown in FIG. 5D, as shown in FIG. 4, a metal layer is deposited on the fourth ILD 145 so as to fill the via holes 148a, 148b, and 148c and is then planarized, thereby forming second plugs 150a, 150b, and 150c. Thereafter, a metal layer is deposited on the fourth ILD 145 and then patterned to contact the respective second plugs 150a, 150b, and 150c, thereby forming metal interconnections 155a, 155b, and 155c.

In this embodiment, the upper electrode 141 and the dielectric layer 136 are formed using CMP. Thus, an etching by-product is not generated on the sidewalls of the dielectric layer 136, and over-etching of the dielectric layer 136 is not required to expose the lower electrode 125b. Accordingly, sputtering of the lower electrode 125b is not required.

Also, while the via holes 112, 148a, 148b, and 148c are being formed to define the first plugs 115 and the second plugs 150a, 150b, and 150c, the ILDs formed of a single material or belonging to the same group are etched without etching the dielectric layer 136 of the capacitor. As a result, the process can be simplified.

Also, as the lower electrode 125b, the dielectric layer 136, and the upper electrode 141 are not defined by the CMP process at the same time, even if a CMP residue remains on the dielectric layer 136, a bridge between the lower electrode 125b and the upper electrode 141 can be prevented. Furthermore, the bottom of the upper electrode 141, which contacts the third metal interconnection 155b, is not directly affected by the CMP process, thus reducing poor contact between the upper electrode 141 and the third metal interconnection 155b.

As described above, according to embodiments of the invention, a lower electrode is planarly formed, and a concave upper electrode and a concave dielectric layer are formed. Here, the dimension of the lower electrode is smaller than that of the bottom of the upper electrode. Thus, a portion of the dielectric layer corresponding to the lower electrode, not the edges of the dielectric layer, is used as a substantial dielectric layer. As a result, even if the edges of the dielectric layer are degraded, characteristics of the capacitor can remain good.

Also, because the dielectric layer and the upper electrode are defined using CMP, an etching by-product is not absorbed in the sidewalls of the dielectric layer and the lower electrode does not require re-sputtering. Further, the dielectric layer is not extended to portions where the first metal interconnection and the second metal interconnection are formed. Thus, it is not required to etch the dielectric layer during the formation of via holes, thus simplifying the process.

Also, a short between the lower electrode and the upper electrode due to CMP residue can be prevented, thus improving contact resistance.

Embodiments of the invention will now be described in a non-limiting way.

In accordance with another aspect of the invention, a flat-type capacitor includes a first metal interconnection formed on a semiconductor substrate; a first interlayer dielectric (ILD) formed on the first metal interconnection; a second ILD formed on the first ILD to include a lower electrode coupled to one side of the first metal interconnection and a second metal interconnection that is electrically isolated from the lower electrode; a third ILD formed on the second ILD to include a concave dielectric layer having edges of both sides and an upper electrode formed along the top surface of the dielectric layer; a fourth ILD formed on the third ILD; and third metal interconnections formed on the fourth ILD and coupled to the upper electrode and second metal interconnection, respectively. The concave upper electrode is larger than the lower electrode. The lower electrode is positioned between the edges of the concave upper electrode.

Also, the upper electrode and the second metal interconnection may be formed of the same material. The lower electrode, the second metal interconnection, and/or the upper electrode may be formed of a material selected from the group consisting of Ti, Ta, W, TiN, TaN, Al, Cu, Ru, Pt, Ir, and a combination thereof. Also, the lower electrode, the second metal interconnection, and the second ILD may have the same thickness.

The dielectric layer may be formed of a material selected from the group consisting of $SiO_2$, $Si_3N_4$, $Ta_2O_5$, $Al_2O_3$, HfO, $ZrO_2$, BST, PZT, and ST. Also, the first through fourth may be composed of the same material.

In accordance with yet another aspect of the invention, a method of manufacturing a flat-type capacitor includes forming a lower interconnection in a predetermined portion of a semiconductor substrate and forming a lower electrode on the lower interconnection so as to be electrically coupled to the lower interconnection. Afterwards, an ILD is formed on the resultant structure where the lower electrode is formed. The ILD is etched until the lower electrode and portions of both sides of the lower electrodes are exposed, thereby defining a concave capacitor region where a capacitor will be formed. A concave dielectric layer and a concave upper electrode are formed in the capacitor region. Then, a first upper interconnection is formed to be electrically coupled to the lower interconnection, and at the same time, a second upper interconnection is formed to be electrically coupled to the upper electrode. Preferably, the upper electrode is larger than the lower electrode.

According to still another aspect of the invention, a first metal interconnection is formed in a predetermined portion of a semiconductor substrate. Next, a first ILD is formed on the semiconductor substrate where the first metal interconnection is formed. The first ILD is formed to expose regions of both sides including a pair of first plugs contacting both sides of the first metal interconnection. Thereafter, a second ILD is formed on the first ILD to include a lower electrode contacting one of the first plugs and a second metal interconnection contacting the other of the first plugs. A third ILD is formed on the second ILD and includes a capacitor region that exposes the lower electrode and portions of the second ILD on both sides of the lower electrode. A dielectric layer and an upper electrode are formed in the capacitor region, thereby forming a capacitor. Next, a fourth ILD is formed on the third ILD. One of two second plugs is formed in the fourth and third ILDs to contact the second metal interconnection, and the other second plug is formed in the fourth ILD to contact the upper electrode. Afterwards, a third metal interconnection is formed to contact the respective second plugs. Preferably, the upper electrode is larger than the lower electrode.

Forming the first ILD includes depositing a first ILD on the semiconductor substrate; etching the first ILD until two separated regions of the first metal interconnection are exposed to form via holes; depositing a conductive layer to fill the via holes; and forming first plugs by planarizing the conductive layer until the first ILD is exposed.

Forming the second ILD includes depositing a second ILD on the first ILD; defining a region where a lower electrode will be formed (hereinafter, referred to as a "lower electrode region") and a region where a second metal interconnection will be formed (hereinafter, referred to as a "second metal interconnection region") by exposing the second ILD until the first plugs and portions adjacent to the first plugs are each exposed; depositing a conductive layer on the second ILD so as to fill the lower electrode region and the second metal interconnection region; and forming a lower electrode and a second metal interconnection by planarizing the conductive layer until the second ILD is exposed.

Forming the dielectric layer and the upper electrode includes depositing a dielectric layer on the first ILD where the capacitor region is defined; depositing a conductive layer for an upper electrode on the dielectric layer; and polishing the conductive layer for the upper electrode and the dielectric layer using CMP until the surface of the third ILD is exposed. Here, forming the dielectric layer and the upper electrode further includes forming a buffer oxide layer after depositing the conductive layer but before polishing the conductive layer and the dielectric layer. Since the buffer layer is removed during the CMP process, the CMP process can be efficiently performed.

The invention claimed is:

1. A method of manufacturing a flat-type capacitor, the method comprising:
    forming a lower interconnection on a predetermined portion of a semiconductor substrate;
    forming a lower electrode that is electrically coupled to the lower interconnection;
    forming an interlayer dielectric over the lower electrode;
    forming an etched region by etching the interlayer dielectric until the lower electrode and an area surrounding the lower electrode is exposed;
    forming a concave dielectric layer and a concave upper electrode in the etched region of the interlayer dielectric, wherein the concave upper electrode is larger than the lower electrode; and
    simultaneously forming a first upper interconnection that is electrically coupled to the lower interconnection, and a second upper interconnection that is electrically coupled to the upper electrode.

2. The method of claim 1, wherein forming a lower electrode that is electrically coupled to the lower interconnection comprises:
    forming a first insulating layer on the semiconductor substrate and the lower interconnection;
    forming at least two plugs in the first insulating layer that are in contact with the lower interconnection, wherein one of the at least two plugs contacts a side of the lower interconnection, and another one of the at least two plugs contacts another side of the lower interconnection; and
    forming a second insulating layer on the first insulating layer and the at least two plugs;
    forming the lower electrode in the second insulating layer in contact with the one of the at least two plugs; and
    forming a metal interconnection in the second insulating layer in contact with the another one of the at least two plugs, wherein the metal interconnection is electrically coupled to the second upper interconnection.

3. The method of claim 2, wherein forming the lower electrode in the second insulating layer and forming the metal interconnection in the second insulating layer comprises:
    defining a first region where the lower electrode will be formed and a second region where the metal interconnection will be formed by etching the second insulating layer until the at least two plugs are exposed;
    depositing a metal layer on the second insulating layer that fills the first and second regions; and
    forming the lower electrode and the metal interconnection by planarizing the metal layer until the surface of the second insulating layer is exposed.

4. The method of claim 1, wherein forming the concave dielectric layer and the concave upper electrode in the etched region of the interlayer dielectric comprises:
    depositing a dielectric layer on the interlayer dielectric and an entire surface of the etched region;
    depositing a conductive layer on an entire surface of the dielectric layer; and
    polishing the conductive layer and the dielectric layer using a chemical mechanical polishing process until a top surface of the interlayer dielectric is exposed.

5. The method of claim 4, further comprising:
    forming a buffer oxide layer after depositing the conductive layer but before polishing the conductive layer and the dielectric layer, wherein the buffer oxide layer is removed during the chemical mechanical polishing process.

6. The method of claim 1, wherein the lower electrode, the second metal interconnection, and the upper electrode comprise a material selected from the group consisting of Ti, Ta, W, TiN, TaN, Al, Cu, Ru, Pt, Ir, and combinations thereof.

7. The method of claim 6, wherein the lower electrode, the second metal interconnection and the upper electrode are deposited at temperatures of about 250° to 500° C.

8. The method of claim 7, wherein the lower electrode, the second metal interconnection, and the upper electrode are formed using a process selected from the group consisting of chemical vapor deposition, physical vapor deposition, atomic layer deposition, and electroplating.

9. The method of claim 1, wherein the dielectric layer comprises a material selected from the group consisting of $SiO_2$, $Si_3N_4$, $Ta_2O_5$, $Al_2O_3$, HfO, $ZrO_2$, BST, PZT, and ST.

10. A method of manufacturing a flat-type capacitor, the method comprising:
    forming a lower metal interconnection on a predetermined portion of a semiconductor substrate;
    forming a first interlayer dielectric on the semiconductor substrate and the lower metal interconnection;
    forming a first and second plug in the first interlayer dielectric that contact the lower metal interconnection;
    forming a second interlayer dielectric on the first interlayer dielectric, the first plug, and the second plug;
    forming a lower electrode in contact with the first plug and a middle metal interconnection in contact with the second plug;
    forming a third interlayer dielectric on the second interlayer dielectric, the lower electrode, and the middle metal interconnection;
    defining a capacitor region by exposing the lower electrode and an area of the second interlayer dielectric that surrounds the lower electrode;
    forming a dielectric layer and an upper electrode in the capacitor region, wherein the upper electrode is larger than the lower electrode;
    forming a fourth interlayer dielectric on the third interlayer dielectric and the capacitor region;
    forming a third plug in the fourth and third interlayer dielectrics that contacts the middle metal interconnection and forming a fourth plug in the fourth interlayer dielectric that contacts the upper electrode; and
    forming a first upper metal interconnection that contacts the third plug and a second upper metal interconnection that contacts the fourth plug.

11. The method of claim 10, wherein forming the first interlayer dielectric and forming a first and second plug comprise:
    depositing a dielectric material on the semiconductor substrate;

forming via holes by etching the first interlayer dielectric until two separate regions of the first metal interconnection are exposed;

depositing a conductive layer on the first dielectric material that fills the via holes; and planarizing the conductive layer until the first dielectric material is exposed.

12. The method of claim 10, wherein forming the second interlayer dielectric, forming the lower electrode, and forming the middle metal interconnection comprise:

depositing a dielectric material on the first interlayer dielectric and the first and second plugs;

forming etched regions by etching the dielectric material until the first plug, the second plug, an area surrounding the first plug, and an area surrounding the second plug are each exposed;

depositing a conductive layer on the dielectric material so as to fill the etched regions; and planarizing the conductive layer until the dielectric material is exposed.

13. The method of claim 10, wherein forming the dielectric layer and the upper electrode comprises:

depositing a dielectric material over an entire surface;

depositing a conductive layer on the dielectric layer; and polishing the conductive layer and the dielectric layer using a chemical mechanical polishing process until the surface of the third interlayer dielectric is exposed.

14. The method of claim 13, further comprising:

forming a buffer oxide layer after depositing the conductive layer but before polishing the conductive layer and the dielectric layer, wherein the buffer layer is removed during the chemical mechanical polishing process.

15. The method of claim 10, wherein the lower electrode, the middle metal interconnection and the upper electrode comprise a material selected from the group consisting of Ti, Ta, W, TiN, TaN, Al, Cu, Ru, Pt, Ir, and combinations thereof.

16. The method of claim 15, wherein the lower electrode, the middle metal interconnection and the upper electrode are deposited at a temperature of about 250° to 500° C.

17. The method of claim 16, wherein the lower electrode, the middle metal interconnection, and the upper electrode are formed using a process selected from the group consisting of chemical vapor deposition, physical vapor deposition, atomic layer deposition, and electroplating.

18. The method of claim 10, wherein the dielectric layer comprises a material selected from the group consisting of $SiO_2$, $Si_3N_4$, $Ta_2O_5$, $Al_2O_3$, HfO, $ZrO_2$, BST, PZT, and ST.

19. The method of claim 10, wherein the first, second, third, and fourth interlayer dielectrics have the same etch selectivity.

* * * * *